United States Patent
Hill et al.

(10) Patent No.: US 9,488,776 B2
(45) Date of Patent: Nov. 8, 2016

(54) METHOD FOR FABRICATING SILICON PHOTONIC WAVEGUIDES

(75) Inventors: Craig M. Hill, Warrenton, VA (US); Andrew T S Pomerene, Leesburg, VA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 796 days.

(21) Appl. No.: 13/543,999

(22) Filed: Jul. 9, 2012

(65) Prior Publication Data

US 2014/0010495 A1    Jan. 9, 2014

(51) Int. Cl.
G02B 6/12 (2006.01)
H01L 27/06 (2006.01)
H01L 21/82 (2006.01)
G02B 6/136 (2006.01)
G02B 6/132 (2006.01)

(52) U.S. Cl.
CPC ............. *G02B 6/12* (2013.01); *G02B 6/12004* (2013.01); *H01L 21/82* (2013.01); *H01L 27/0617* (2013.01); *G02B 6/132* (2013.01); *G02B 6/136* (2013.01)

(58) Field of Classification Search
CPC ...... G02B 6/10; G02B 6/12; G02B 6/12002; G02B 2006/12061
USPC .............................................. 438/31; 257/623
See application file for complete search history.

(56) References Cited

U.S. PATENT DOCUMENTS 7,339,254 B1 * 3/2008 Kempf .......................... 257/577

* cited by examiner

*Primary Examiner* — Kevin Parendo
(74) *Attorney, Agent, or Firm* — Antony P. Ng; Russell Ng PLLC

(57) ABSTRACT

A method for fabricating electronic and photonic devices on a semiconductor substrate using complementary-metal oxide semiconductor (CMOS) technology is disclosed. A substrate is initially patterned to form a first region for accommodating electronic devices and a second region for accommodating photonic devices. The substrate within the first region is thicker than the substrate within the second region. Next, an oxide layer is formed on the substrate. The oxide layer within the first region is thinner than the oxide layer within the second region. A donor wafer is subsequently placed on top of the oxide layer. The donor substrate includes a bulk silicon substrate, a sacrificial layer and a silicon layer. Finally, the bulk silicon substrate and the sacrificial layer are removed from the silicon layer such that the silicon layer remains on the oxide layer.

5 Claims, 5 Drawing Sheets

METHOD FOR FABRICATING SILICON PHOTONIC WAVEGUIDES

BACKGROUND OF THE INVENTION

1. Technical Field

The present invention relates to integrated circuits in general, and in particular to integrated circuits having electronic and photonic devices. Still more particularly, the present invention relates to a method for fabricating electronic and photonic devices on a semiconductor substrate using complementary-metal oxide semiconductor (CMOS) technology.

2. Description of Related Art

With the current processing technology, it is possible to fabricate photonic devices and electronic devices on the same silicon substrate. However, the optimal buried oxide (BOX) thickness for photonic devices is typically different from the optimal BOX thickness for electronic devices. Photonic devices generally require a relatively thick BOX to minimize optical loss. In contrast, electrical devices tend to require a much thinner BOX. Consequently, it would be desirable to provide a method for fabricating photonic devices and electronic devices on the same semiconductor substrate having different BOX thickness.

SUMMARY OF THE INVENTION

In accordance with a preferred embodiment of the present invention, a substrate is patterned to form a first region for accommodating electronic devices and a second region for accommodating photonic devices. The substrate within the first region is thicker than the substrate within the second region. Next, an oxide layer is formed on the substrate. The oxide layer within the first region is thinner than the oxide layer within the second region. A donor wafer is subsequently placed on top of the oxide layer. The donor substrate includes a bulk silicon substrate, a sacrificial layer and a silicon layer. Finally, the bulk silicon substrate and the sacrificial layer are removed from the silicon layer such that the silicon layer remains on the oxide layer.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
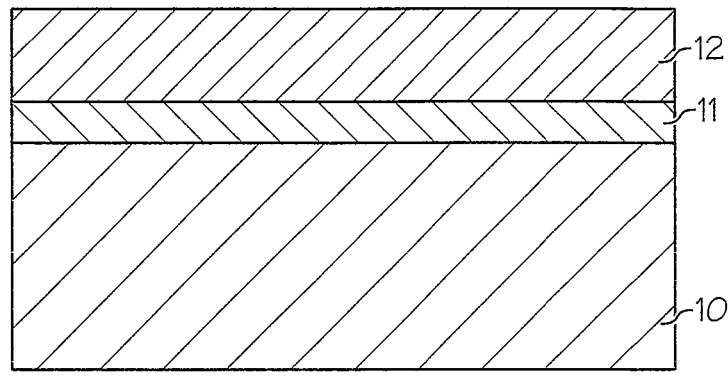
FIGS. 1A-1G are diagrams illustrating successive steps of a method for fabricating electronic and photonic devices on a silicon substrate, in accordance with a preferred embodiment of the present invention.

Referring now to the drawings, and in particular to FIGS. 1A-1G, there are illustrated a method for fabricating electronic and photonic devices on a semiconductor substrate, in accordance with a preferred embodiment of the present invention. The method of the present invention begins with a bulk silicon substrate 10 having a pad oxide layer 11 and a pad nitride layer 12, as shown in FIG. 1A. Preferably, pad oxide layer 11 is approximately 90 Å thick, and pad nitride layer 12 is approximately 1,200 Å thick.

Figure 1B:
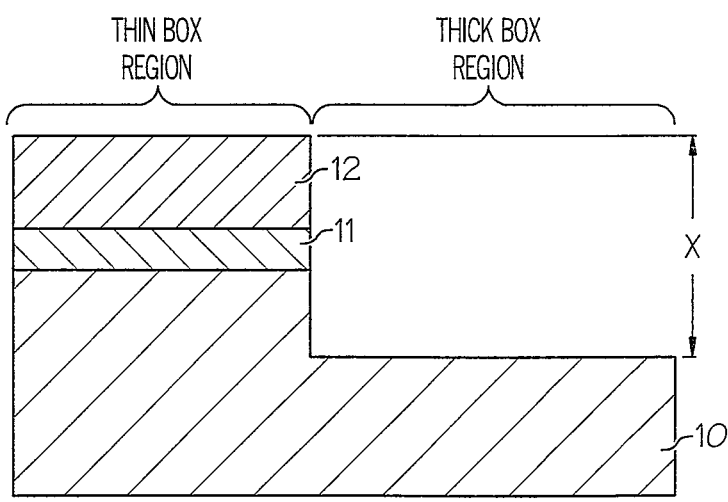

Next, areas intended for the formation of electronic devices and photonic devices are then patterned and etched using standard complementary-metal oxide semiconductor (CMOS) techniques. Electronic devices are intended to be formed within a thin buried oxide (BOX) region, and photonic devices are intended to be formed within the thick BOX region. Specifically, pad nitride layer 12, pad oxide layer 11 and substrate 10 are etched, as depicted in FIG. 1B. The etch depth x for substrate 10 depends on the final desired BOX thickness.

Figure 1C:
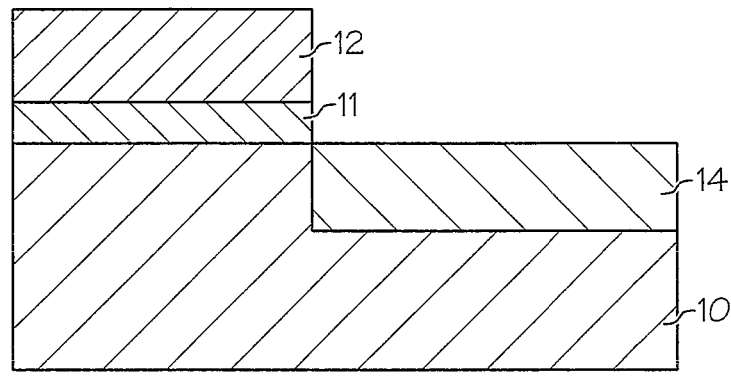

An oxide layer 14 is then formed on top of substrate 10 by using pad nitride layer 12 as a mask, as shown in FIG. 1C. If necessary, a chemical-mechanical polishing (CMP) and a HF dip are utilized to remove excess oxide layer 14 such that oxide layer 14 is planar with the thin BOX region of substrate 10 or planar with pad nitride layer 12.

Figure 1D:
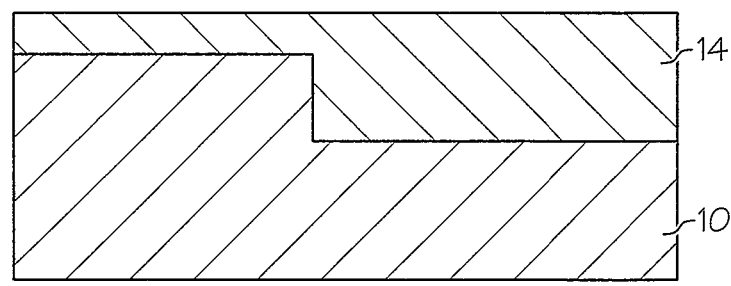

After removing pad nitride layer 12 and (optionally) pad oxide layer 11, addition oxide is grown on top of oxide layer 14, as depicted in FIG. 1D. If necessary, a CMP step can be performed to improve the planarity of oxide layer 14. At this point, oxide layer 14 within the thin BOX region is thinner than oxide layer 14 within the thick BOX region. As mentioned above, electronic devices will be built within the thin BOX region, and photonic devices will be built within the thick BOX region.

Figure 1E:
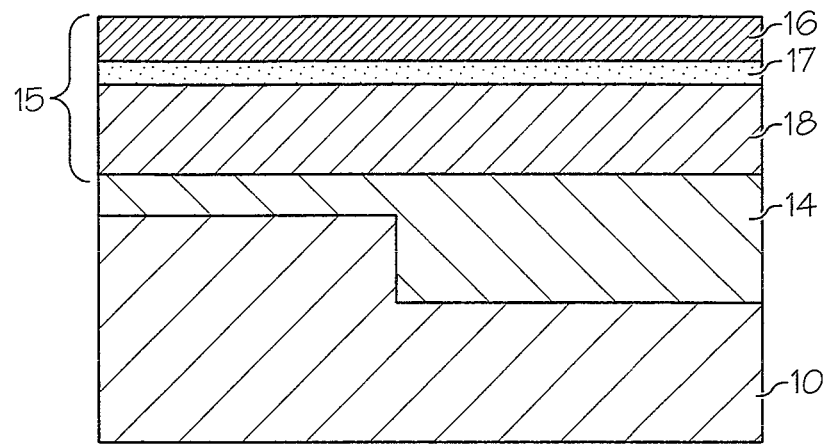

Next, a donor wafer 15 is placed (upside down) on top of substrate 10 to be bonded with substrate 10, as shown in FIG. 1E. Donor wafer 15 include a bulk silicon substrate 16, a high-dose implant or weak silicon layer 17, and a silicon layer 18.

Donor wafer 15 can be prepared separately via one of the following two methods. The first method includes a complete oxidation on bulk silicon substrate 16 to form silicon layer 18, followed by multiple ion implantations, such as hydrogen and helium ion implantations, to form high-dose implant layer 17. The second method includes a generation of weak silicon layer 17 (instead of implant layer 17) during silicon formation, followed by an oxidation to form silicon layer 18.

Figure 1F:
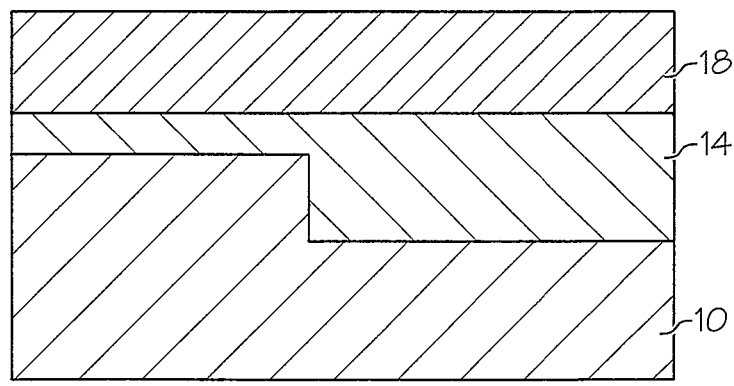

Next, a high-temperature anneal is used to soften layer 17 such that bulk silicon substrate 16 and layer 17 can be separated and removed from silicon layer 18, as depicted in FIG. 1F.

Figure 1G:
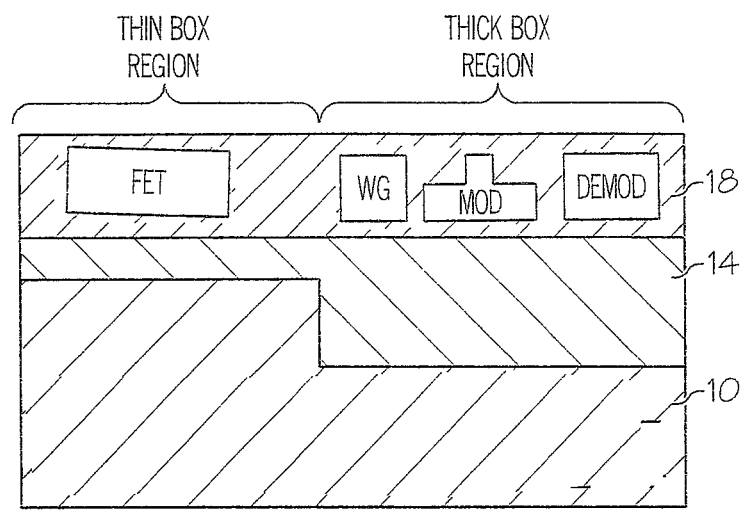

After a CMP step has been performed to smooth silicon layer 18, substrate 10 is now ready for further processing to fabricate electronic and photonic devices at thin BOX and thick BOX regions, respectively. For example, a field-effect transistor (FET) can be formed within the thin BOX region, and a waveguide (WG), a modulator (MOD) and/or a demodulator (DEMOD) can be formed within the thick BOX region, as shown in FIG. 1G. The FET represents electronic devices in general. The waveguide, modulator and demodulator collectively represent photonic devices in general.

In this method, the multiple substrate thicknesses are formed by removing some substrate material. Alternatively, the multiple substrate thicknesses may be formed by selectively adding silicon material to form a thicker Si substrate. This selective addition may be done using a selective epitaxial Si growth. Also, in the method described, the BOX layer was completely formed from oxide on the handle wafer and not from the donor wafer. Alternatively, the BOX layer may be completely supplied by the donor wafer or from a combination of oxides from the handle and donor wafers.

Figure 2A:
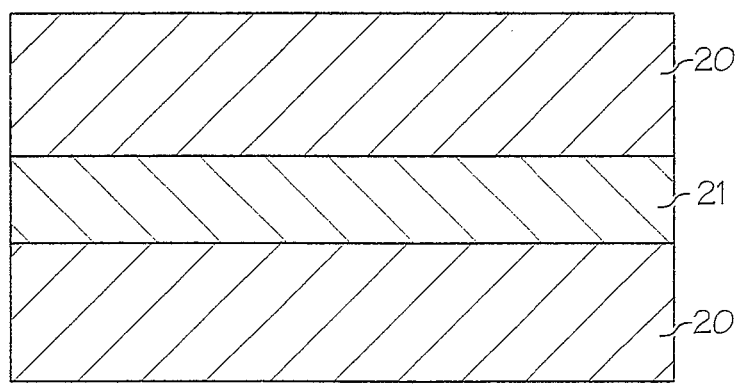
FIGS. 2A-2C are diagrams illustrating successive steps of a method for fabricating electronic and photonic devices on a silicon substrate, in accordance with an alternative embodiment of the present invention.
Figure 2B:
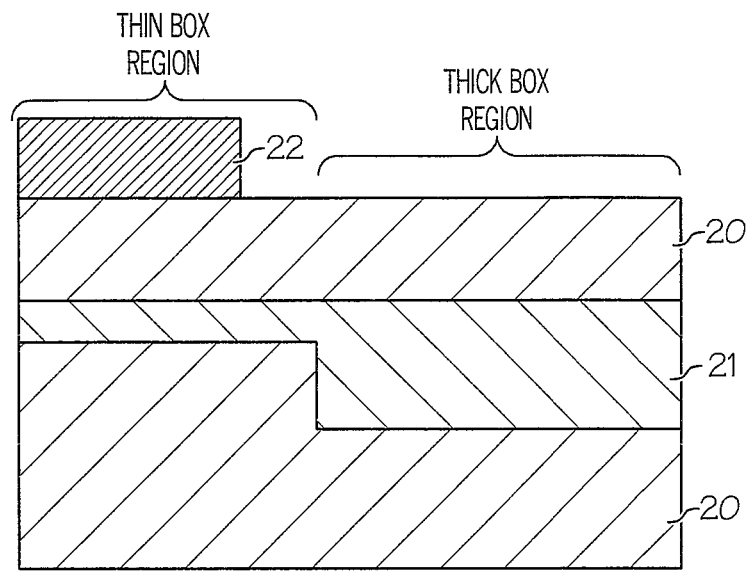
Figure 2C:
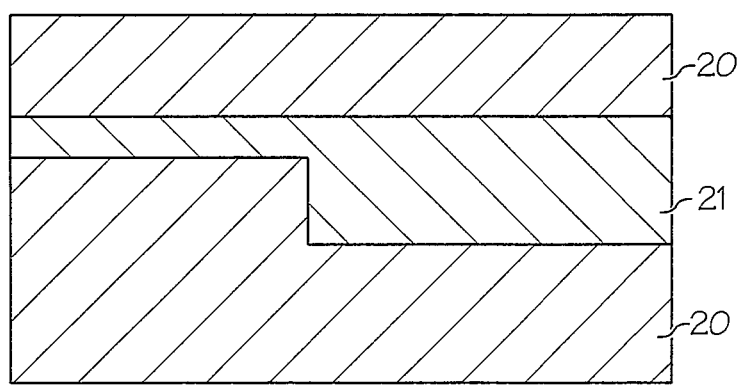

The multi-thickness BOX layer can be formed as follows. With reference now to FIGS. 2A-2C, there are illustrated a method for fabricating electronic and photonic devices on a semiconductor substrate, in accordance with an alternative embodiment of the present invention. Initially, oxygen is implanted within a bulk silicon substrate 20 to form an oxygen rich layer 21 within silicon substrate 20, as shown in FIG. 2A.

Next, a hard mask 22 is used to cover a thin BOX region of substrate 20, and additional oxygen implantation is utilized to form a thicker region of oxygen rich layer 21, as depicted in FIG. 2B. The thicker region of oxygen rich layer 21 coincides with the thick BOX region of substrate 20.

Substrate 20 is then annealed to transform oxygen rich layer 21 into a BOX layer 21, as shown in FIG. 2C. Electronic devices can be built within the thin BOX region, and photonic devices can be built within the thick BOX region. The thickness of BOX layer 21 within the thin BOX region can be zero when the silicon over BOX layer 21 is single crystal.

As has been described, the present invention provides an improved method for fabricating electronic and photonic devices on a silicon substrate. The present invention allows a direct integration of both active and passive high-index contrast photonic structures with standard CMOS process technology in such a way as not only to allow all of the individual devices to work at an optimal level, but also to enable them to work together to form complex circuits that allow a circuit designer to take advantage of the best function of each type of devices to achieve the best possible performance.

1 GHz or smaller optical channel spacing, allowing for fiber communications at a level never previously imagined.

While the invention has been particularly shown and described with reference to a preferred embodiment, it will be understood by those skilled in the art that various changes in form and detail may be made therein without departing from the spirit and scope of the invention.

What is claimed is:

1. An integrated circuit comprising:
   a substrate having a first region for accommodating electronic devices and a second region for accommodating photonic devices, wherein said first region is directly adjacent to said second region, wherein said substrate within said first region is thicker than said substrate within said second region;
   an oxide layer located directly on said substrate within said first and second regions, wherein said oxide layer within said first region is thinner than said oxide layer within said second region; and
   a silicon layer located directly on said oxide layer within said first and second regions.

2. The integrated circuit of claim 1, wherein said substrate within said first region is epitaxially grown from said substrate.

3. The integrated circuit of claim 1, wherein an electronic device is fabricated on said first region and a photonic device is fabricated on said second region.

4. The integrated circuit of claim 1, wherein one of said electronic devices is a transistor.

5. The integrated circuit of claim 1, wherein one of said photonic devices is a waveguide, a modulator or a demodulator.

* * * * *